(12) United States Patent
Lee et al.

(10) Patent No.: US 7,608,536 B2
(45) Date of Patent: Oct. 27, 2009

(54) METHOD OF MANUFACTURING CONTACT OPENING

(75) Inventors: Jung Seock Lee, Seoul (KR); Hyun Suk Sung, Busan (KR)

(73) Assignee: Hynix Semiconductor Inc., Icheon-si (KR)

( * ) Notice: Subject to any disclaimer, the term of this patent is extended or adjusted under 35 U.S.C. 154(b) by 160 days.

(21) Appl. No.: 11/984,054

(22) Filed: Nov. 13, 2007

(65) Prior Publication Data

US 2009/0004847 A1 Jan. 1, 2009

(30) Foreign Application Priority Data

Jun. 29, 2007 (KR) ...................... 10-2007-0065287

(51) Int. Cl.
*H01L 21/311* (2006.01)
(52) U.S. Cl. .................. 438/633; 438/639; 438/696; 438/692; 257/E21.577
(58) Field of Classification Search ............... 438/633, 438/639, 696, 692; 257/E21.577
See application file for complete search history.

(56) References Cited

U.S. PATENT DOCUMENTS 6,037,253 A * 3/2000 Chung ...................... 438/639
6,103,588 A * 8/2000 Jeng et al. ................. 438/399
6,429,123 B1 * 8/2002 Tseng ....................... 438/642
6,444,575 B1 * 9/2002 Yu et al. ..................... 438/639
6,458,692 B1 10/2002 Kim
7,319,274 B2 * 1/2008 Beyer et al. ................ 257/774
2006/0073699 A1 * 4/2006 Lee et al. .................... 438/639

FOREIGN PATENT DOCUMENTS

KR 10-2003-0057612 A 7/2003

\* cited by examiner

*Primary Examiner*—George Fourson
(74) *Attorney, Agent, or Firm*—Finnegan, Henderson, Farabow, Garrett & Dunner, L.L.P.

(57) ABSTRACT

Disclosed is a method of manufacturing a semiconductor device, in which a high-temperature SOD (spin on dielectric) annealing process is performed to prevent a SOD crack, and a nitride film, serving as a capping layer, is formed over the entire surface of a bit line pattern to prevent a tungsten layer, which is a bit line electrode layer, from being oxidized during the high-temperature annealing process.

In a process of forming the bit line pattern, over etching is performed to recess a lower interlayer insulating film such that the thickness of the interlayer insulating film to be etched in a subsequent process, that is, a process of etching a storage node contact hole, is reduced. In this way, it is possible to prevent the storage node contact hole from not being opened.

12 Claims, 5 Drawing Sheets

METHOD OF MANUFACTURING CONTACT OPENING

This application is based upon and claims the benefit of priority to Korean Patent Application No. 10-2007-0065287, filed on Jun. 29, 2007, the entire contents of which are incorporated herein by reference.

TECHNICAL FIELD

The present invention relates to a method of manufacturing a semiconductor device. More specifically, the method discloses a high-temperature SOD (spin on dielectric) annealing process performed to prevent a SOD crack; and a nitride film, serving as a capping layer, formed over the entire surface of a bit line pattern to prevent a tungsten layer, which is a bit line electrode layer, from being oxidized during the high-temperature annealing process. The invention further discloses a process of forming the bit line pattern, during which over etching is performed to recess a lower interlayer insulating film such that the thickness of the interlayer insulating film is to be etched in a subsequent process, that is, a process of etching a storage node contact hole, is reduced, thereby preventing the storage node contact hole from not being opened.

BACKGROUND

In recent years, with an improvement in the integration of a semiconductor device and an increase in the aspect ratio of a bit line pattern, gap fill property of an interlayer insulating film has become important. An SOD (spin on dielectric) material is used to improve the gap fill property. Since the SOD material is coated by a spin method, the gap fill characteristics are improved. However, since the SOD material contains Si—H—N, it changes to $SiO_2$ during the annealing process. In this case, during the annealing process, an SOD crack occurs due to the characteristics of the SOD material. In order to solve the problem of the SOD crack, the high-temperature annealing process needs to be performed in an atmosphere of $H_2/O_2$ at a temperature of 500° C. or more. However, the high-temperature annealing process oxidizes the tungsten layer, which is the bit line electrode layer.

In order to prevent the oxidation of the tungsten layer a method of not performing the etching process, which forms the spacers after the lining insulating film is deposited, has been proposed.

FIGS. 1A to 1C are cross-sectional views illustrating a method of manufacturing a semiconductor device according to the prior art.

FIG. 1A shows a method of forming a storage node contact hole without performing the etching process that forms the spacers. In the method shown in FIG. 1A, a first interlayer insulating film 110 is formed over a semiconductor substrate 100 having landing plug contacts 105 provided therein. Then, a bit line pattern 123 is formed over the first interlayer insulating film 110. In this case, the bit line pattern 123 included stack structure of a bit line electrode layer 115 and a bit line hard mask layer 120.

The first interlayer insulating film 110 of an oxide film, the bit line electrode layer 115 of a tungsten layer, and the bit line hard mask layer 120 of a nitride film.

Referring to FIGS. 1B and 1C, a lining insulating film 125 having a predetermined thickness is formed over the entire surface including the surface of the bit line pattern 123. The lining insulating film 125 may be formed of a nitride film. Then, a second interlayer insulating film 135 is formed over the entire surface of the lining insulating film 125 formed over the bit line pattern 123.

Subsequently, the second interlayer insulating film 135 is etched to form storage node contact holes 140 through which the landing plug contacts 105 are exposed.

In this method, as described above, a process of etching the lining insulating film 125 is omitted, and the tungsten layer, which is the bit line electrode layer 115, is covered with the nitride film, which is the lining insulating film 125, thereby making it possible to prevent the oxidation of the tungsten layer. However, the lining insulating film 125 that remains after the etching process, which forms the storage node contact holes 140, serves as an etching barrier, and causes a problem in that the electrode contact holes are not opened.

In the method of manufacturing a semiconductor device according to the prior art, when the high-temperature annealing process is performed to prevent the SOD crack, the tungsten layer, which is the bit line electrode layer, is oxidized. When the nitride film, serving as a capping layer, is formed over the entire surface of the bit line pattern in order to prevent the oxidation of the bit line electrode layer, the nitride film serves as an etching barrier during a subsequent process of forming storage node contact holes, which causes a problem in that the storage node contact holes are not opened.

SUMMARY

A method of manufacturing a semiconductor device is provided. The method includes: forming a first interlayer insulating film over a semiconductor substrate having landing plug contacts provided therein; forming a bit line pattern over the first interlayer insulating film; recessing a portion of the first interlayer insulating film using the bit line pattern as a mask; depositing a lining insulating film over the entire surface including the surface of the bit line pattern; forming a second interlayer insulating film over the lining insulating film; performing a CMP process until the bit line pattern is exposed; and selectively etching the second interlayer insulating film and the first interlayer insulating film over the landing plug contact to form a storage node contact hole exposing the landing plug contact.

The first interlayer insulating film is formed of an oxide film.

The bit line pattern comprises a stack structure of a bit line electrode layer of tungsten and a bit line hard mask layer of a nitride film.

The recessing of the first interlayer insulating film is performed using a dry etching method employing a carbon fluoride gas.

The carbon fluoride gas is any one of C4F8, C5F8, C3F8, and a combination thereof.

The recessed first interlayer insulating film has a thickness of about 50 to about 100 Å.

The lining insulating film includes a nitride film.

The second interlayer insulating film is an SOD (spin on dielectric) oxide film.

Performing an annealing process after the second interlayer insulating film is formed.

The annealing process is performed at a temperature of about 500 to about 700° C.

The annealing process is a wet annealing process using a gas comprising O2 and H2 gas or a dry annealing process using a comprising O2 gas.

After the forming of the storage node contact hole, forming a spacer for a storage node over the inner wall of the storage node contact hole.

DETAILED DESCRIPTION

Hereinafter, an exemplary embodiment of the invention will be described in detail with reference to the accompanying drawings.

FIGS. 2A to 2E are cross-sectional views illustrating a method of manufacturing a semiconductor device according to an embodiment of the present invention.

Figure 1A:
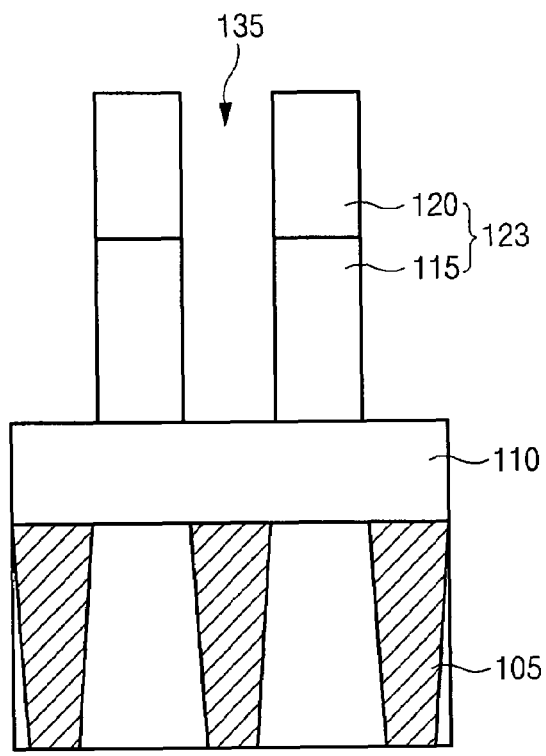
FIGS. 1A to 1C are cross-sectional views illustrating the method of manufacturing a semiconductor device according to the prior art.
Figure 1B:
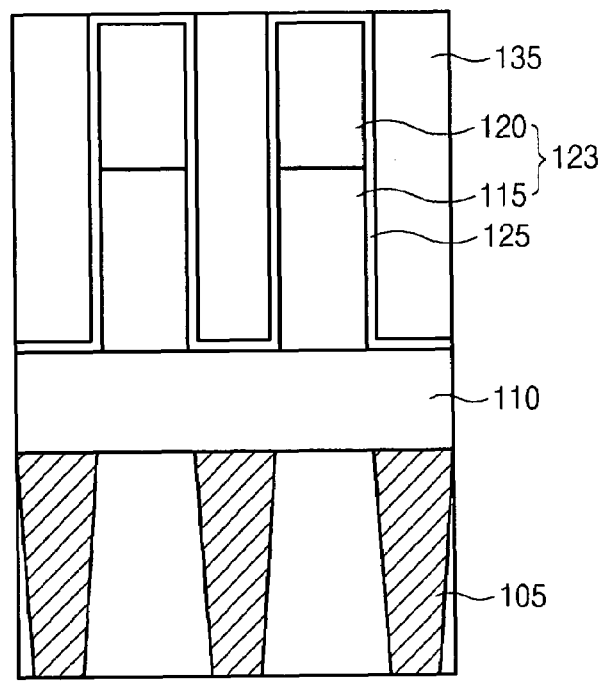
Figure 1C:
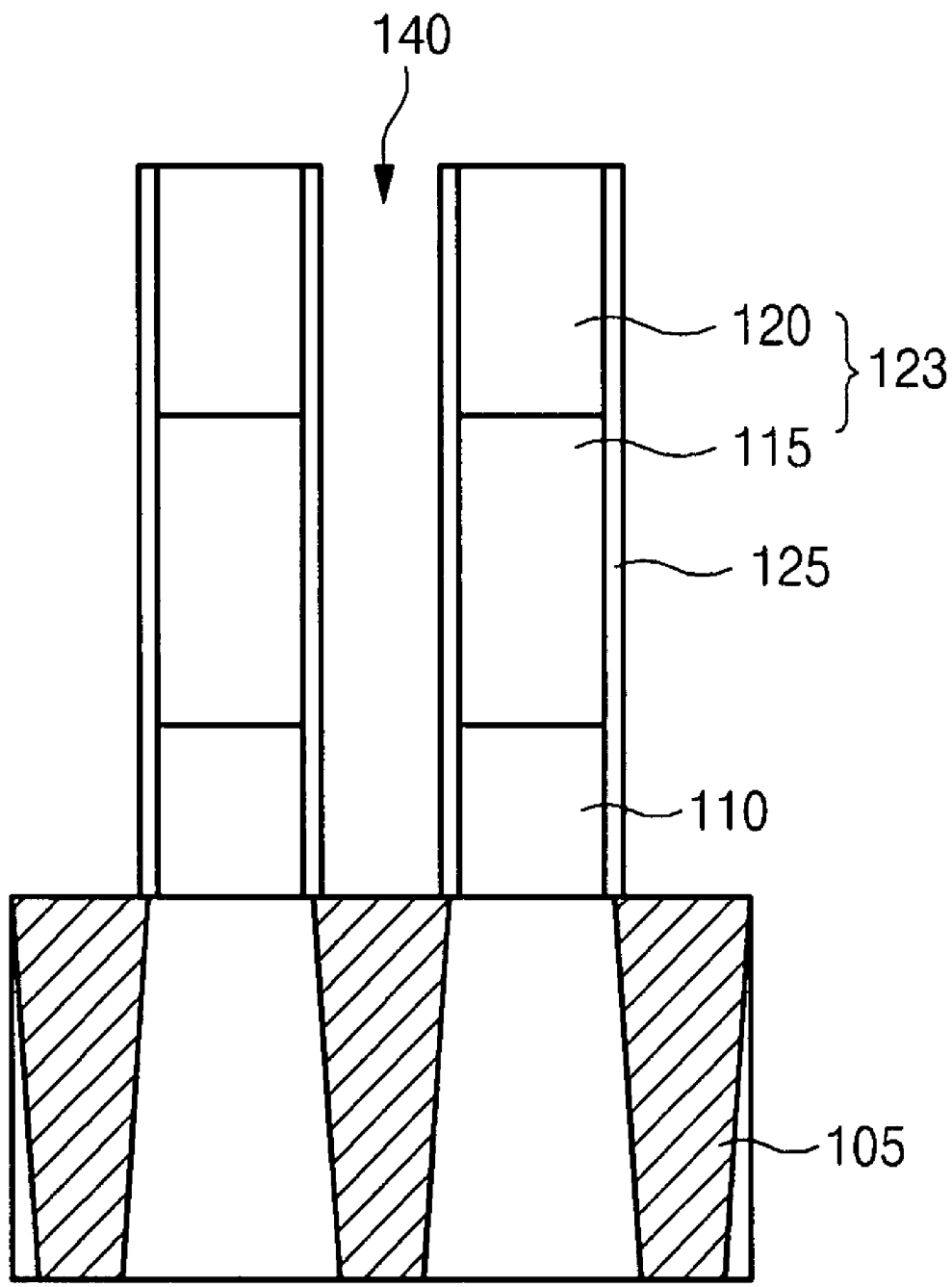
Figure 2A:
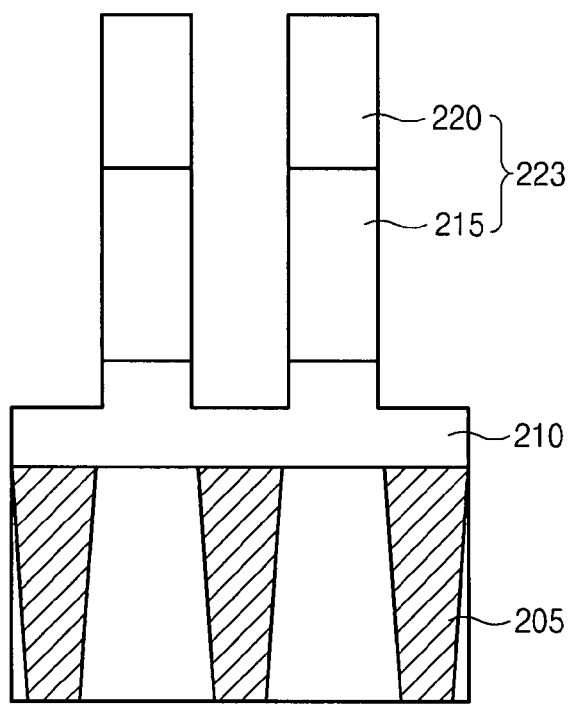
FIGS. 2A to 2E are cross-sectional views illustrating a method of manufacturing a semiconductor device according to an embodiment of the invention.

Referring to FIG. 2A, a first interlayer insulating film 210 is formed over a semiconductor substrate 200 having landing plug contacts 205 provided therein.

Then, a bit line electrode layer 215 and a bit line hard mask layer 220 are sequentially formed over the first interlayer insulating film 210.

Preferably, the bit line electrode layer 215 is formed of a tungsten layer, and the bit line hard mask layer 220 is formed of a nitride film.

Then, the bit line hard mask layer 220 and the bit line electrode layer 215 are etched to form a bit line pattern 223.

In this case, the etching process is performed using the bit line pattern 223 as a mask to recess the first interlayer insulating film 210.

The etching process is performed using a rich polymer chemistry, preferably, a dry etching method a employing a carbon fluoride gas, to minimize the loss of the bit line hard mask layer 220, and in the etching process, the loss of the first interlayer insulating film 210 artificially occurs.

Preferably, The carbon fluoride gas is any one of C4F8, C5F8, C3F8, and a combination thereof.

As such, portions of the first interlayer insulating film 210 are recessed to reduce the thickness of the first interlayer insulating film 210 to be etched in a subsequent process, that is, a process of forming a storage node contact hole, which makes it possible to prevent the storage node contact hole from not being opened.

Preferably, the recessed first interlayer insulating film 210 has a thickness of about 50 to about 100 Å from the surface of the semiconductor substrate 200.

Figure 2B:
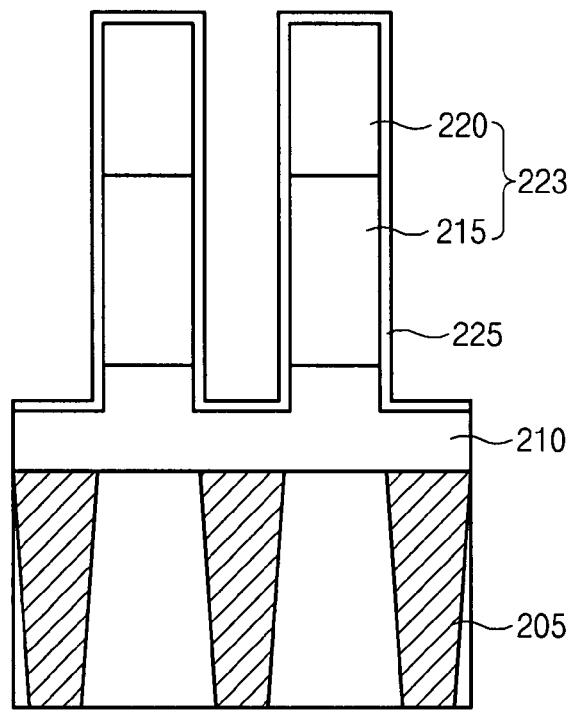

Referring to FIG. 2B, a nitride film lining insulating film 225 having a predetermined thickness is deposited over the entire surface including the surface of the bit line pattern 223.

Figure 2C:
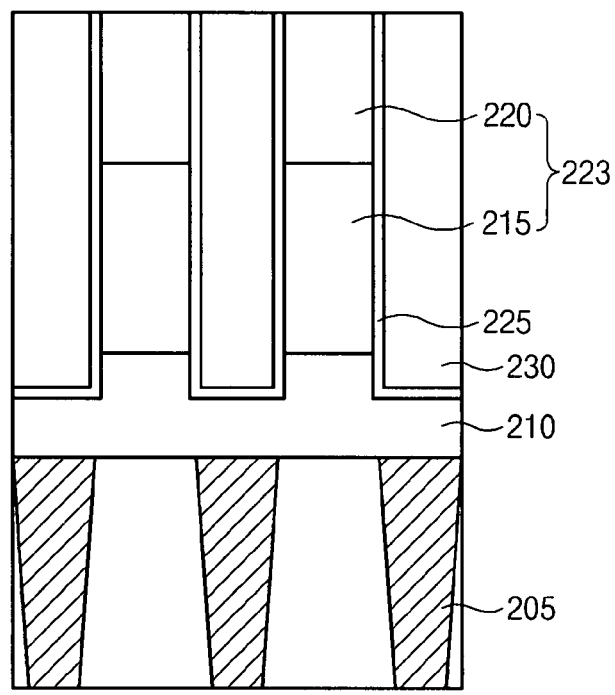

Referring to FIG. 2C, a second interlayer insulating film 230 is formed over the entire surface including the surface of the bit line pattern 223 having the lining insulating film 225 deposited thereon.

In this case, the second interlayer insulating film 230 is preferably composed of an SOD (spin on dielectric) oxide film.

Then, an annealing process is performed on the stack structure, and then a CMP (chemical mechanical polishing) process is performed on the stack structure until the bit line hard mask layer 220, which is an upper layer of the bit line pattern 223, is exposed.

In the CMP process, it is preferable that the lining insulating film 225 deposited over the bit line hard mask layer 220 be removed.

The annealing process is performed at a high temperature of about 500 to about 700° C. In this case, a wet annealing process using a gas included O2 and H2 gas or a dry annealing process using a gas included O2 gas may be used. The high-temperature annealing process can prevent an SOD crack.

In addition, since the lining insulating film 225 covers the bit line pattern 223, this structure makes it possible to prevent a tungsten layer, which is the bit line electrode layer 215, from being oxidized during the high-temperature annealing process.

Figure 2D:
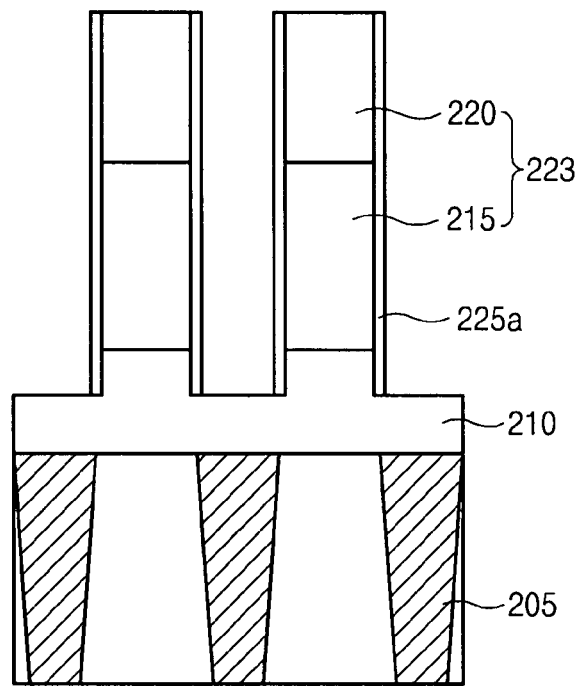

Referring to FIG. 2D, the second interlayer insulating film 230 in a storage node contact region is etched. In the etching process, over etching is performed on the second interlayer insulating film 230 to etch the lining insulating film 225 that is disposed at a lower part of the storage node contact hole 235 such that spacers 225a remain at both sides of the bit line pattern 223.

Figure 2E:
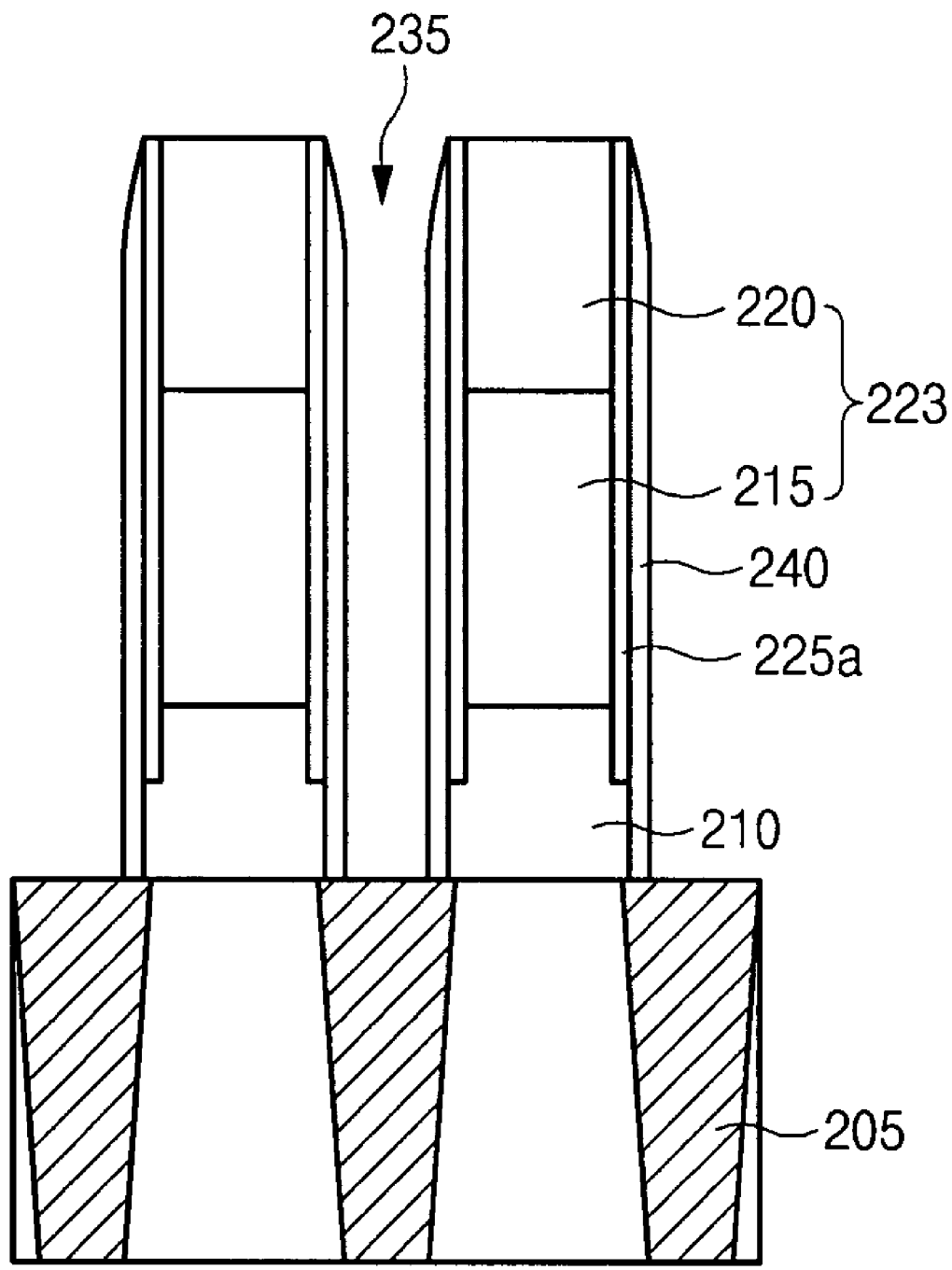

Referring to FIG. 2E, the first interlayer insulating film 210 remaining at the lower part is etched using the spacers 225a using a mask, thereby forming the storage node contact hole 235.

Then, an insulating film (not shown) for a storage node is deposited with a predetermined thickness over the entire surface including the surface of the storage node contact hole 235.

Subsequently, a process of etching the entire surface is performed to remove the insulating film (not shown) for a storage node that is formed over the bit line pattern 223 and the semiconductor substrate 200 such that the spacer 240 for a storage node remains over only the inner wall of the storage node contact hole 235.

During the process of etching the entire surface, over etching is performed to completely remove the first interlayer insulating film 210 that remains at the lower part, thereby forming the storage node contact hole 235 through which the landing plug contact 205 is exposed.

In the method of manufacturing the semiconductor device according to the above-described embodiment of the invention, a high-temperature SOD annealing process is performed to prevent a SOD crack. A nitride film, serving as a capping layer, is formed over the entire surface of the bit line pattern to prevent a tungsten layer, which is the bit line electrode layer, from being oxidized during the high-temperature annealing process. As a result, it is possible to improve characteristics of an element.

The foregoing embodiments of the invention are illustrative and not limiting. It will be apparent to those skilled in the art that various modifications and variations may be made in the present invention without departing from the spirit and scope consistent with the invention as defined by the appended claims.

What is claimed is:

1. A method of manufacturing a semiconductor device, the method comprising:

forming a first interlayer insulating film over a semiconductor substrate having landing plug contacts provided therein;

forming a bit line pattern over the first interlayer insulating film;

recessing a portion of the first interlayer insulating film using the bit line pattern as a mask;

depositing a lining insulating film over the entire surface including the surface of the bit line pattern;

forming a second interlayer insulating film over the lining insulating film;

performing a CMP process until the bit line pattern is exposed; and selectively etching the second interlayer insulating film and the first interlayer insulating film over the landing plug contact to form a storage node contact hole exposing the landing plug contact.

2. The method of claim 1, wherein the first interlayer insulating film is formed of an oxide film.

3. The method of claim 1, wherein the bit line pattern comprises a stack structure of a bit line electrode layer of tungsten and a bit line hard mask layer of a nitride film.

4. The method of claim 1, wherein the recessing of the first interlayer insulating film is performed using a dry etching method employing a carbon fluoride.

5. The method of claim 4, wherein the carbon fluoride is any one of $C_4F_8$, $C_5F_8$, $C_3F_8$, and a combination thereof.

6. The method of claim 1, wherein the recessed first interlayer insulating film has a thickness of 50 to 100 Å.

7. The method of claim 1, wherein the lining insulating film includes a nitride film.

8. The method of claim 1, wherein the second interlayer insulating film is a SOD (spin on dielectric) oxide film.

9. The method of claim 1, further comprising: performing an annealing process after the second interlayer insulating film is formed.

10. The method of claim 9, wherein the annealing process is performed at a temperature of about 500 to about 700° C.

11. The method of claim 9, wherein the annealing process is a wet annealing process using a gas comprising $O_2$ and $H_2$ gas or a dry annealing process using a gas comprising $O_2$ gas.

12. The method of claim 1, further comprising, after the forming of the storage node contact hole:

forming a spacer for a storage node over the inner wall of the storage node contact hole.

* * * * *